(12) United States Patent
Zimmerman et al.

(10) Patent No.: US 11,668,733 B2
(45) Date of Patent: Jun. 6, 2023

(54) MULTI-STAGE CURRENT MEASUREMENT ARCHITECTURE

(71) Applicant: Keithley Instruments, LLC, Solon, OH (US)

(72) Inventors: Mark D. Zimmerman, Twinsburg, OH (US); Wayne C. Goeke, Hudson, OH (US); Martin J. Rice, Sagamore Hills, OH (US)

(73) Assignee: Keithley Instruments, LLC, Solon, OH (US)

( * ) Notice: Subject to any disclaimer, the term of this patent is extended or adjusted under 35 U.S.C. 154(b) by 69 days.

(21) Appl. No.: 16/678,941

(22) Filed: Nov. 8, 2019

(65) Prior Publication Data

US 2020/0150153 A1 May 14, 2020

Related U.S. Application Data

(60) Provisional application No. 62/757,979, filed on Nov. 9, 2018.

(51) Int. Cl.
*G01R 19/00* (2006.01)
*G01R 31/3185* (2006.01)

(52) U.S. Cl.
CPC . *G01R 19/0038* (2013.01); *G01R 31/318572* (2013.01)

(58) Field of Classification Search
CPC ........ G01R 19/0038; G01R 31/318572; G01R 15/08; G01R 19/00; G01R 15/00
See application file for complete search history.

(56) References Cited

U.S. PATENT DOCUMENTS

| | | | | |
|---|---|---|---|---|
| 4,641,089 A | * | 2/1987 | Pearman | G01R 19/30 433/32 |
| 5,283,512 A | * | 2/1994 | Stadnick | H02J 7/0016 320/101 |
| 5,917,331 A | * | 6/1999 | Persons | G01R 31/3004 324/762.02 |
| 6,323,668 B1 | * | 11/2001 | Hashimoto | G01R 31/2834 324/750.3 |
| 6,476,667 B1 | * | 11/2002 | Teggatz | H02H 9/025 327/427 |
| 8,115,474 B2 | * | 2/2012 | Vulovic | G01R 19/16571 324/76.19 |
| 9,594,097 B2 | * | 3/2017 | Bogner | G01R 1/20 |
| 10,931,119 B2 | * | 2/2021 | Har-Shai | H01L 31/02021 |

(Continued)

*Primary Examiner* — Feba Pothen
(74) *Attorney, Agent, or Firm* — Miller Nash LLP; Andrew J. Harrington

(57) ABSTRACT

A test and measurement instrument includes a current measurement device having an input to accept an electrical current for measurement, an output to pass an output current output from the current measurement device, a sense path through which the electrical current is measured, and an active bypass device to pass an amount of current from the input of the current measurement device to the output of the current measurement device without passing through the sense path. The active bypass device may be tuned to allow the current sense device to operate without bypass within a specific range of target current values. Some current measurement devices may include more than one active bypass circuits, each tuned for a different range of input current values.

15 Claims, 7 Drawing Sheets

(56) References Cited

U.S. PATENT DOCUMENTS

2004/0046576 A1* 3/2004 Manhaeve ......... G01R 31/3173
                                                324/713
2016/0020603 A1* 1/2016 Parthasarathy ........ H02H 9/046
                                                361/56

* cited by examiner

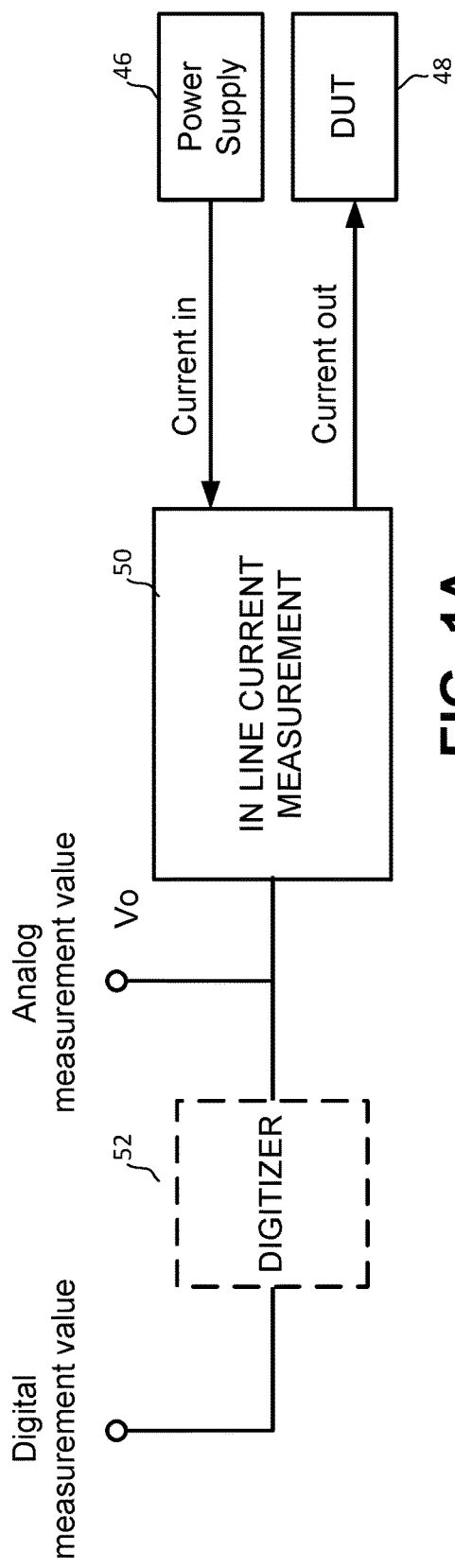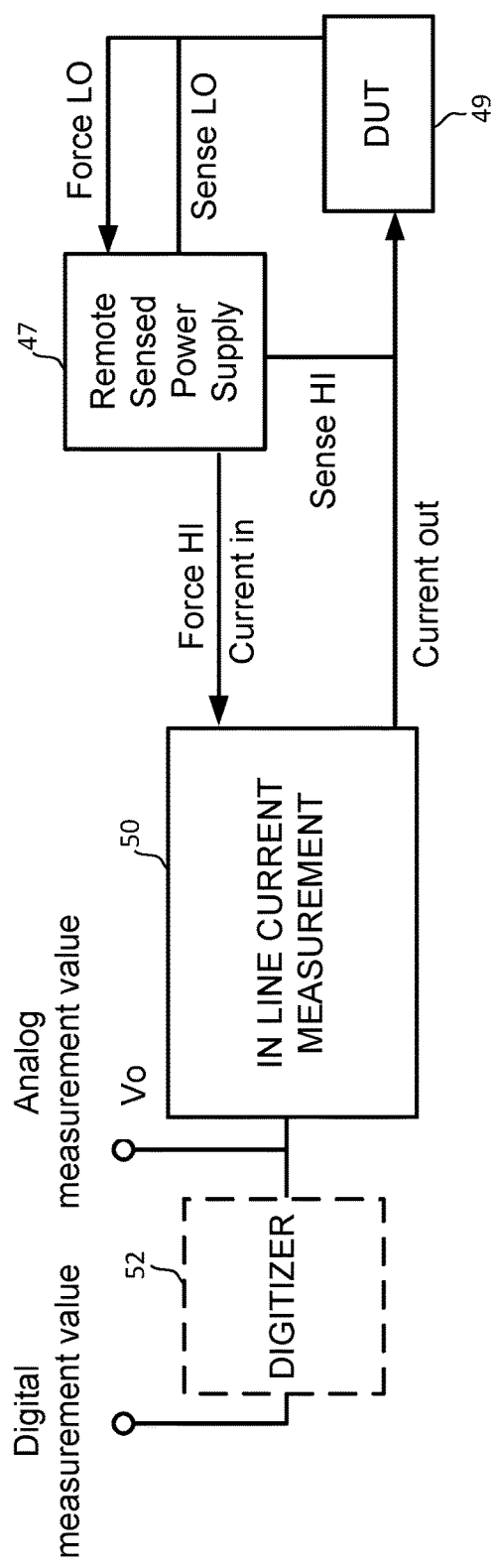
FIG. 1A
FIG. 1B

MULTI-STAGE CURRENT MEASUREMENT ARCHITECTURE

PRIORITY

This disclosure claims benefit of U.S. Provisional Application No. 62/757,979, titled "MULTI-STAGE CURRENT PROBE ARCHITECTURE FOR HIGH-SPEED HIGH-PRECISION AND HIGH-DYNAMIC-RANGE CURRENT MEASUREMENT," filed on Nov. 9, 2018, which is incorporated herein by reference in its entirety.

FIELD OF THE INVENTION

The subject matter is related to devices and methods for high-speed current measurement of electronic devices.

BACKGROUND

Measuring, characterizing, and understanding a device's electrical current consumption is an important design step in a wide variety of industries. Measuring electrical current in Power delivery networks (PDNs), for instance, requires a high bandwidth current measurement. Some devices, such as Internet of Things (IOT) devices, quickly cycle through different states of operation having many orders of magnitude difference in current draw. The current draw of these devices is marked by periods of low current draw punctuated by activity pulses where the current draw can briefly increase by about 1,000,000 times. For example, an active listening device draws relatively low current while it waits for a wake-word. Once the wake-word is detected, the device captures the ambient vocal signals that follow the wake-word, converts them to electrical signals, then transmits the signals to a control device on a communication network, such as a cloud network. After the listening device receives an appropriate command over the cloud network, the listening device performs the action directed to it by the control device. Although wake-word detection occurs at relatively low current draw on the listening device, after being wakened, the listening device quickly switches to a high-current mode to perform the remainder of the actions. After the final action is performed, the listening device re-enters the low-current mode while it waits for another wake-word. Other devices have multiple current modes. It is important for manufacturers, repair shops, and others to be able to measure the current drawn by various devices in all modes, i.e., as the device quickly switches its power supply needs.

If a large resistance value shunt resistor is used as an electrical current measuring device when measuring low levels of electrical current, a large burden voltage may appear during times of high current pulses. This burden voltage occurs because a portion of the high current is drawn through the large shunt resistor during the high current pulse. Therefore, unless the power supply is a very large supply that can change output levels very quickly, the voltage supplied to the attached device drops quickly through the large shunt resistor. The voltage drop may be so severe that the supplied voltage drops below the minimum operating voltage of the connected device, which may cause the device to turn off or shut down. If a small resistance value shunt resistor is used as the current measuring device, the burden voltage may be kept small, but the details of the periods of low current draw may be lost in the noise floor of the measurement system.

A clamp-style test and measurement probe may allow for very high bandwidth measurements with very little burden on the circuit being tested. But the noise floor and DC accuracy of clamp-style probes may be limited. For example, the minimum resolvable current may be insufficient for full characterization of many of today's designs.

Embodiments of the disclosed technology address shortcomings in the prior art.

BRIEF DESCRIPTION OF THE DRAWINGS

FIG. 1A is a circuit block diagram illustrating an in-line electrical current measurer according to embodiments, along with typical connected devices.

FIG. 1B is a circuit block diagram illustrating an in-line electrical current measurer according to embodiments, along with other types of typical connected devices.

DETAILED DESCRIPTION

As described herein, embodiments are directed to circuits and methods for high-speed current measurement of electronic devices. Embodiments of the disclosed technology may provide current measurement capability over a greater range and with more resolution than existing solutions, without sacrificing on burden voltage or bandwidth.

FIG. 1A is a circuit block diagram illustrating an in-line electrical current measurement device 50. The current measurement device 50 receives an input current from a device, such as a power supply 46. The current measurement device 50 also sends current to a device, such as a device being tested, or Device Under Test (DUT) 48. Because the current measurement device 50 is part of the current supply path from the power supply 46 to the DUT 48, sometimes a device such as the current measurement device 50 is referred to as an in-line current measurement device, although not all embodiments of the invention are limited to being in-line devices.

In operation, the current measurement device 50 measures the amount of current provided by the power supply 46 to the DUT 48. The current measurement may be provided as an analog voltage, illustrated in FIG. 1 as Vo. The current measurement may also be digitized through a digitizer 52, such as an Analog to Digital Converter (ADC) or other appropriate device. In such an embodiment the output is a digital output with a value that corresponds to the electrical current measured by the current measurement device 50.

FIG. 1B is similar to FIG. 1A, except the connected power supply is a remote sensed power supply 47, such as a Series 2280S Power supply available from Keithley Instruments. In this example, the power supply 47 attempts to control the voltage measured between the Sense HI and Sense LO leads by changing the voltage between the Force HI and Force LO (i.e. ground) leads. Remote sensed power supplies typically limit the user to a 1 Volt drop between the Force HI and Force LO lines to maintain system operation, otherwise a connected DUT 49 could realize a drop of input voltage and turn off. In many instances, previous in-line current measurement devices exceeded the 1 Volt drop because of relatively high burden voltages plus any voltage drop across the Force HI lead. Embodiments of the invention, conversely, as described below, may be configured to limit burden voltages. Limiting the burden voltage helps to prevent such large voltage drops in power supplied to the DUT 49, and thus ensure continued DUT operation during testing.

Figure 2:
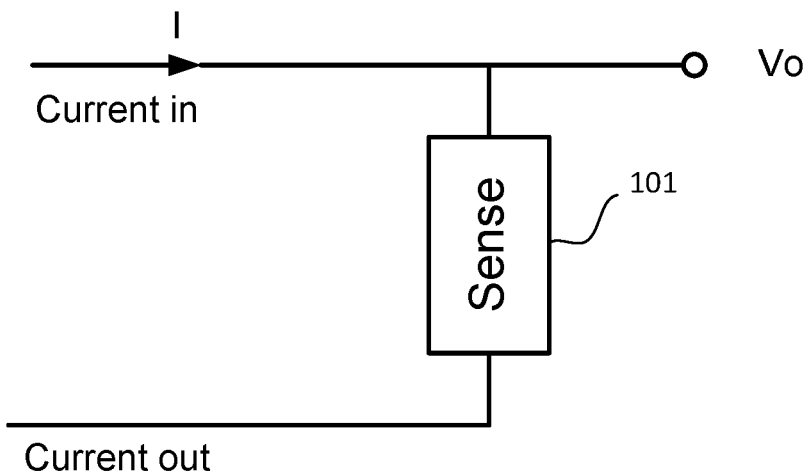
FIG. 2 is a circuit diagram of a current measurement device that uses a sense element, such as a shunt resistor.

FIG. 2 is a circuit diagram, showing a method of current measurement that uses a sense element 101. The simple method of current measurement depicted in FIG. 1 uses the sense element 101 to develop a voltage (Vo) from an input current (I). The sense element 101 may be a resistance element of a size selected for the particular range of current measurements. The burden voltage is given as I*R, which means that a large increase in electrical current may cause a dropout condition for systems with a fixed power supply due to the large voltage drop during switching, as described above.

Figure 3:
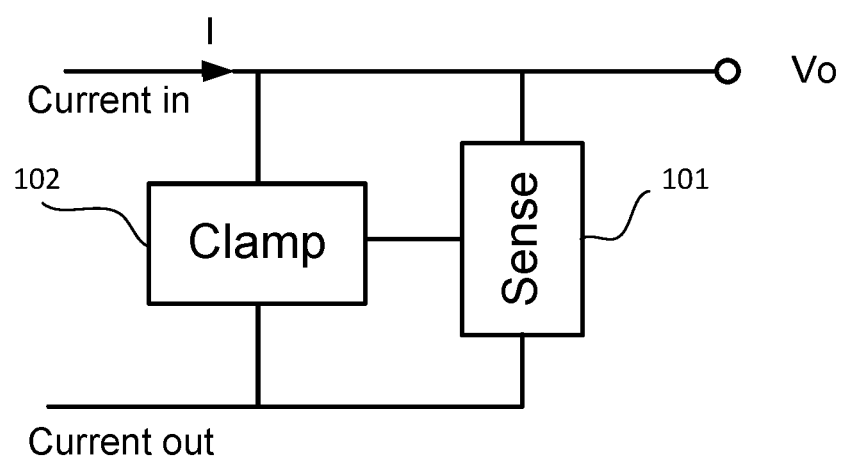
FIG. 3 is a circuit diagram of a current measurement device that uses a sense element and an active clamp, according to embodiments.

FIG. 3 is a block circuit diagram illustrating a method and device for current measurement that uses a sense element 101 and an active clamp 102, according to embodiments. The combination of the sense element 101 and an active clamp 102 is an example of circuit components that may be present in the current measurement device 50 of FIG. 1. The active clamp 102 shunts current away from the sense element 101 based upon a signal from the sense element 101, thus limiting the voltage. This active clamp 102 may be used to limit the power dissipation in the sense element 101 and/or to limit the burden voltage developed by the system.

The active clamp 102 may include a sensing circuit to give bipolar voltage clamping at any desired voltage level, meaning the active clamp 102 performs a clamping action when its sensing circuit detects either a positive or negative voltage having sufficient magnitude to turn on the active clamp, as described below. The active clamp 102 may be disabled and thus not shunt any current when the voltage is within the desired limits. Furthermore, the clamp may be configured with its active circuits having limited gain. This gives a "softer" clamp that can operate linearly at a much higher speed and avoids causing errors due to nonlinear device switching in the circuit.

In one embodiment, the active clamp 102 includes a pair of n-type Metal Oxide Semiconductor (NMOS) transistors coupled in parallel, as well as a positive sensing element and a negative sensing element. As the voltage being sensed by the positive sensing element increases toward the positive voltage limit, the positive sensing circuit increases the voltage on a gate of its coupled NMOS transistor, which begins to turns on the transistor and shunt current to cause current to bypass the sense element 101. During this period the negative sensing element is not sensing a negative voltage, so its voltage produced for its connected NMOS transistor is zero, or below the turn-on voltage of the NMOS transistor, and therefore its NMOS transistor remains off.

Similarly, as the voltage being sensed by the negative sensing element increases toward the negative voltage limit, the negative sensing circuit increases the voltage on a gate of its coupled NMOS transistor, which begins to turns on the transistor and shunt current to cause current to bypass the sense element 101. During this period the positive sensing element is not sensing a positive voltage, so its voltage produced for its connected NMOS transistor is zero, or below the turn-on voltage of the NMOS transistor, and therefore its NMOS transistor remains off.

Figure 4:
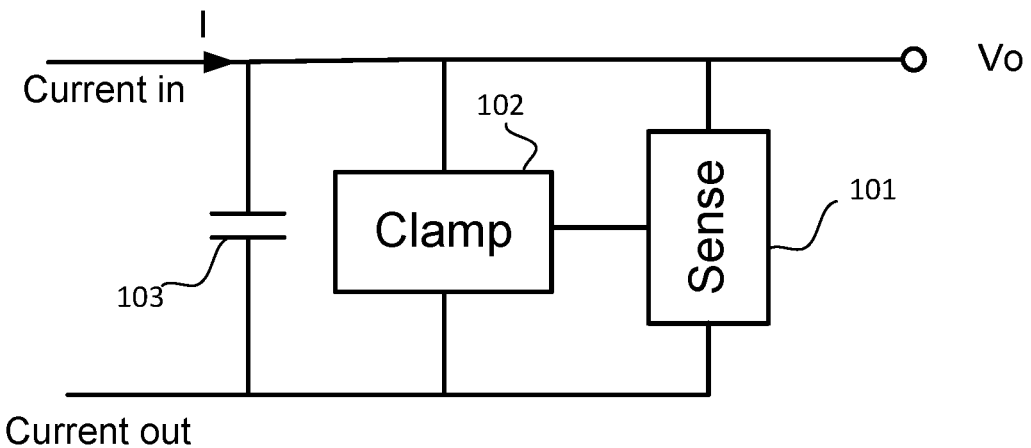
FIG. 4 is a circuit diagram of a current measurement device that uses a sense element, an active clamp, and a bypass capacitor, according to embodiments.

FIG. 4 is a circuit diagram of a current measurement device that uses a sense element 101 and an active clamp 102, according to embodiments. As illustrated in FIG. 4, the embodiment of FIG. 3 may be modified by adding a capacitor 103 in parallel with the active clamp 102 and the sense element 101. The capacitor 103 may, for example, be sized to match the cutoff frequency of the active clamp 102. The capacitor 103 may then shunt sudden current spikes outside the bandwidth of the active clamp 102. This may cause the circuit to appear capacitive instead of inductive at high frequencies, which may be desirable for current shunt devices.

Figure 5:
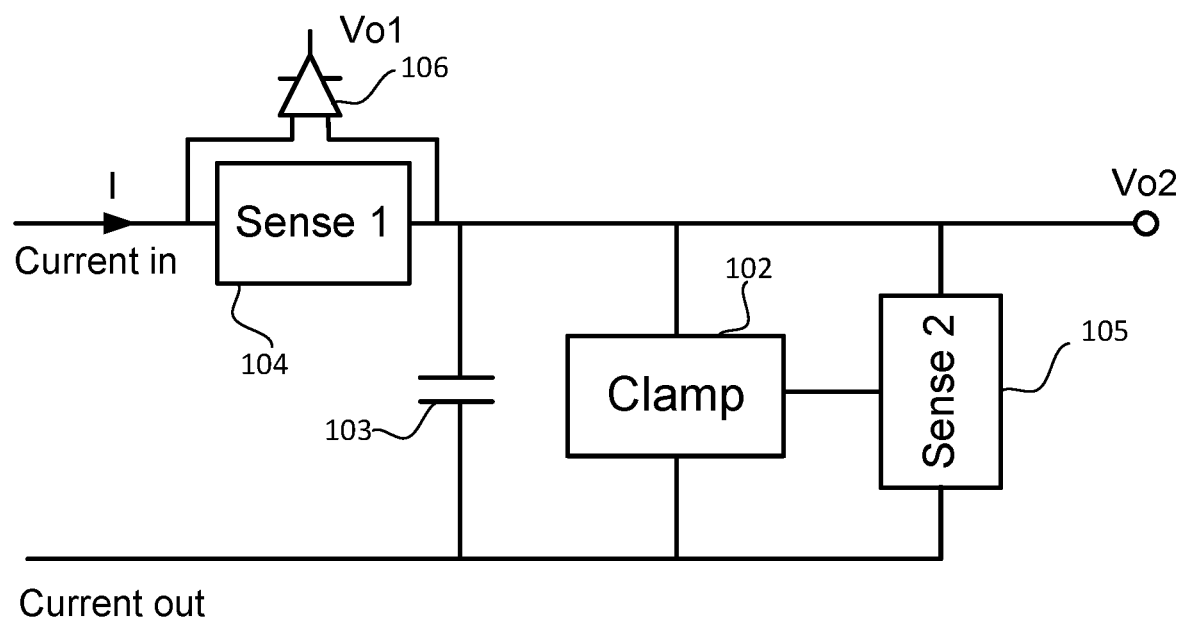
FIG. 5 is a circuit diagram of a current measurement device that uses multiple sense elements, an active clamp, and a bypass capacitor, according to embodiments.

FIG. 5 is a circuit diagram, showing a method of current measurement that uses multiple sense elements 104, 105 and an active clamp 102, according to embodiments. As illustrated in FIG. 5, the embodiment of FIG. 4 may be altered by including an additional sensing element 104 and amplifier 106, which may also include an optional digitizer, such as an ADC, in the circuit. In the configuration illustrated in FIG. 5, the voltage across the first sense element 104 (Vo1) will always be proportional to the current I, while the voltage across the second sense element 105 (Vo2) will be proportional to I as long as the clamp 102 is not shunting current.

In embodiments, resistors may be used for the sense elements 104, 105. If resistors are used for the sense element 104, 105, and the second sense element 105 is chosen to be much larger than the first sense element 104, the circuit illustrated in FIG. 5 may act as a seamless, two-range ammeter. For smaller currents, the larger, second sense element 105 is used to measure the current with greater fidelity. As the current increases, the clamp 102 activates and limits the burden voltage of the current measurement circuit. When the clamp 102 activates, Vo2 may no longer be an accurate representation of the current I. But Vo1 remains valid and the burden voltage remains low, allowing the current measurement to continue. The loss of fidelity from the smaller, first sense element 104 is less impactful as the magnitude of the signal being measured increases.

Figure 6:
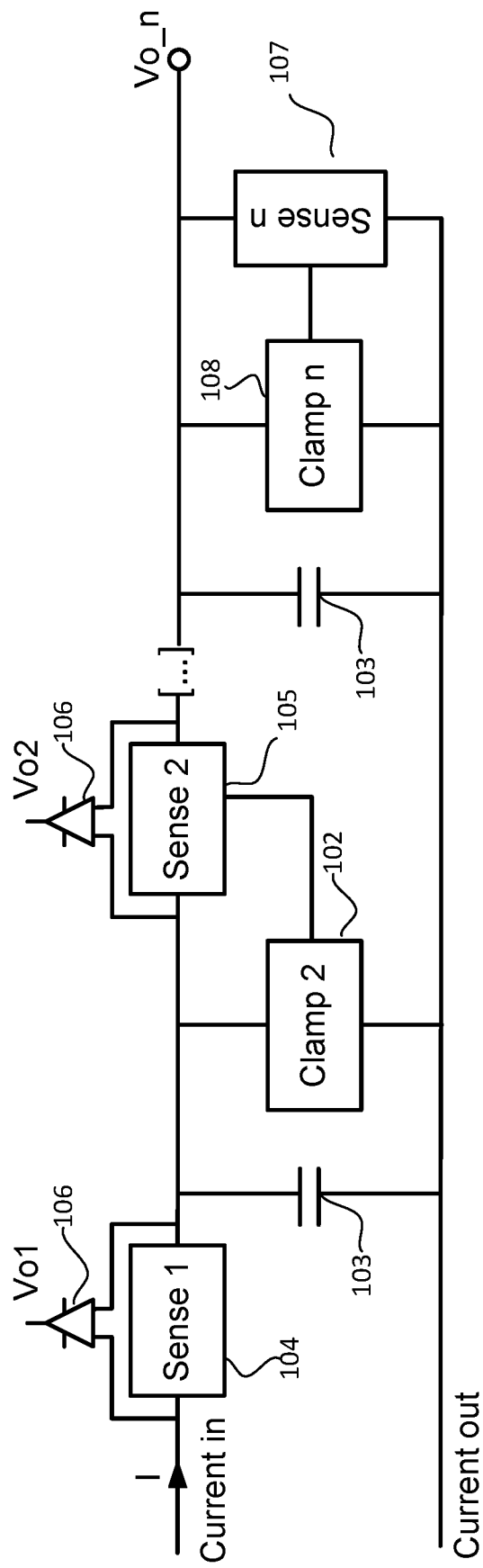
FIG. 6 is a circuit diagram of a current measurement device that uses multiple sense elements, multiple active clamps, and multiple bypass capacitors, according to embodiments.

FIG. 6 is a circuit diagram, showing a method of current measurement that uses multiple sense elements 104, 105, 107 and multiple active clamps 102, 108, according to embodiments. As illustrated in FIG. 6, the embodiment of FIG. 5 may be altered by including additional stages. In the illustrated configuration, each clamp's level may be set independently to determine the limit of the burden voltage at each stage. With very small currents, if the circuit of FIG. 6 is so configured, the best measurement is provided by the last sense element (the nth sense element 107) and its output Vo_n. As the current to be measured increases and the nth active clamp 108 turns on, the then-best measurement is provided by the n−1 sense element, and so on. Including the bypass capacitors 103 causes the bandwidth of each stage to decrease, with the first sense element 104 being the fastest and the nth sense element 107 being the slowest. The bypass capacitors 103 may also prevent this ladder-like system from appearing inductive and causing battery dropouts on any of its measurement stages.

Figure 7:
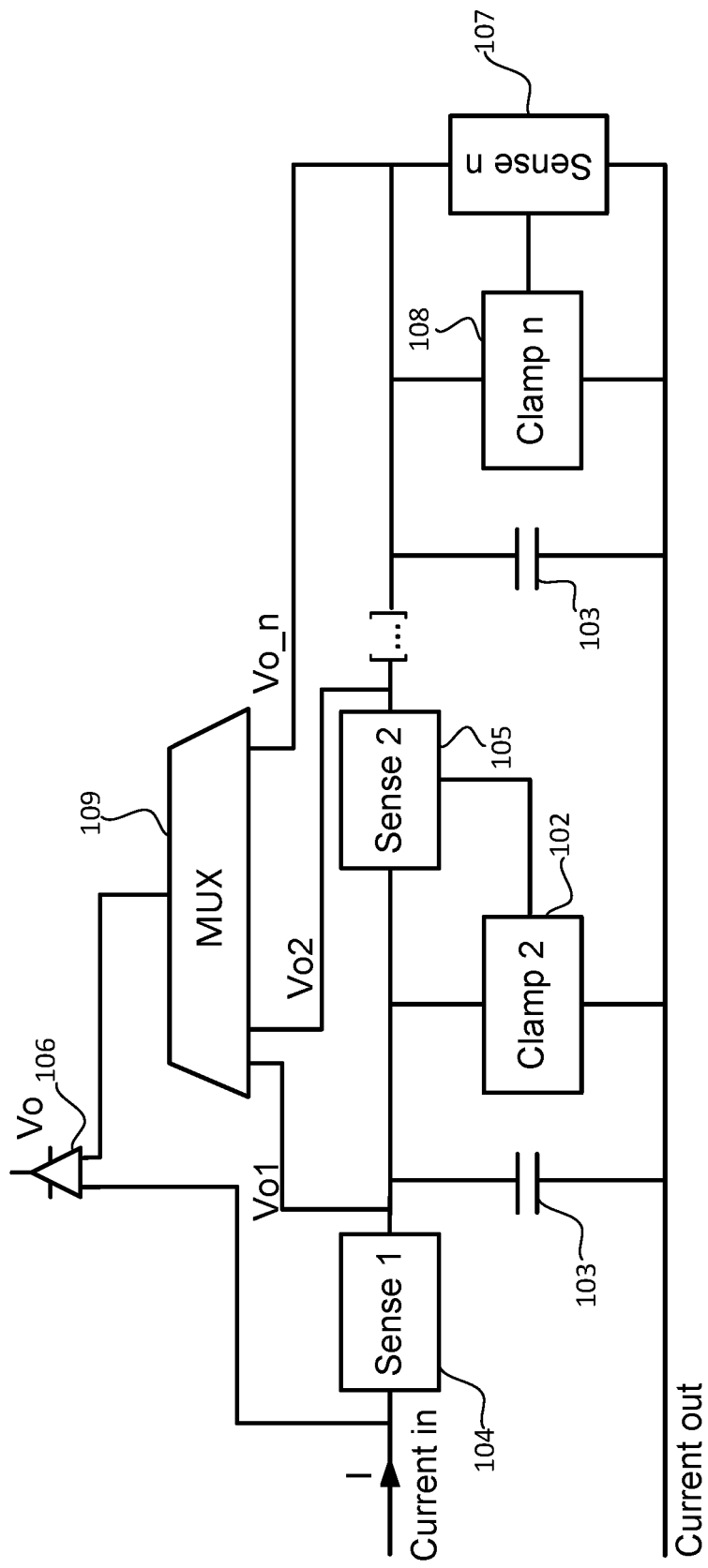
FIG. 7 is a circuit diagram of a current measurement device that uses multiple sense elements, multiple active clamps, and multiple bypass capacitors, according to embodiments.

FIG. 7 is a circuit diagram, showing a method of current measurement that uses multiple sense elements 104, 105, 107 and multiple active clamps 102, 108, according to embodiments. As illustrated in FIG. 7, the design complexity of the embodiment of FIG. 6 may be simplified by defining the output Vo as the difference between a sense element's voltage and the input voltage, rather than differentially monitoring each sense element. A multiplexer 109 may then be controlled to switch in a sense element signal based on which of the active clamps 102, 108 are active. This simplified arrangement allows for operation with only a single ADC and amplifier 106, though the arrangement may lose the benefit of multiple, simultaneous measurements. The single ADC may, for example, operate to digitize the output of the amplifier, labeled "Vo" in FIG. 7.

For a purely resistive sense element, there may be a tradeoff between bandwidth and the magnitude of the voltage signal. Increasing the resistor value may produce a larger output voltage and improve the signal to noise ratio. But the measurement bandwidth is set by the product of the bypass capacitor 103 and the sense resistor, meaning that a smaller resistor value may be desired for higher bandwidth operation. An active shunt circuit may allow for the bandwidth and burden voltage of a resistor to be improved by making the surrounding circuit "see" a much smaller resistor.

Figure 8:
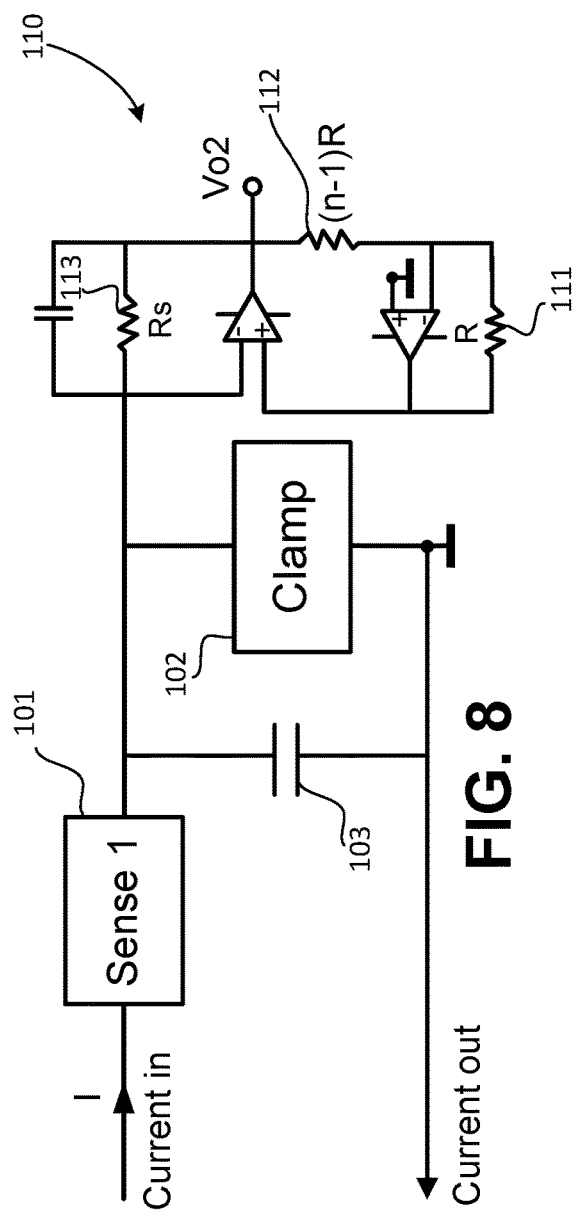
FIG. 8 is a circuit diagram of a current measurement device that uses a sense element, an active clamp, and an active shunt, according to embodiments.

FIG. 8 is a block circuit diagram showing a possible implementation of a current measurement device that uses a sense element 101, an active clamp 102, and an active shunt 110, according to embodiments. As illustrated in FIG. 8, because of the structure of the active shunt 110, the resistance value sensed by the active clamp 102, the bypass capacitor 103, and the source of the current I is (Rs/n), where "n" may be any positive number. For example, the bottom resistor 111 may be R=100 Ohms, the second resistor 112 may be (100−1)*R=9.9 kOhms, and the sensing resistor 113 may be Rs=100 Ohms. In this example, the circuit would have the apparent input resistance Rs/n, giving the circuit a high bandwidth and low burden voltage as if Rs 113 were actually 1 Ohm. At the same time, the full current is still flowing across Rs 113. So, the example illustrated in FIG. 8 gains the advantage of a signal that is 100 times larger than what a 1 Ohm resistor would produce in a conventional configuration such as illustrated in FIG. 2. With the configuration as illustrated in FIG. 8, the positive and negative sensors in the active clamp 102 may be coupled to the Vo2 signal, allowing the clamp 102 to benefit from the larger signal, as well.

There are multiple arrangements of op-amps that can create an active shunt circuit, such as the active shunt 110 of FIG. 8. U.S. Pat. No. 9,274,145 provides additional details on some example configurations for an active shunt circuit.

Directions such as "bottom" (used above to refer to the bottom resistor 111) are used for convenience and in reference to the views provided in the figures. The circuit may have a number of orientations and configurations in actual use.

Figure 9:
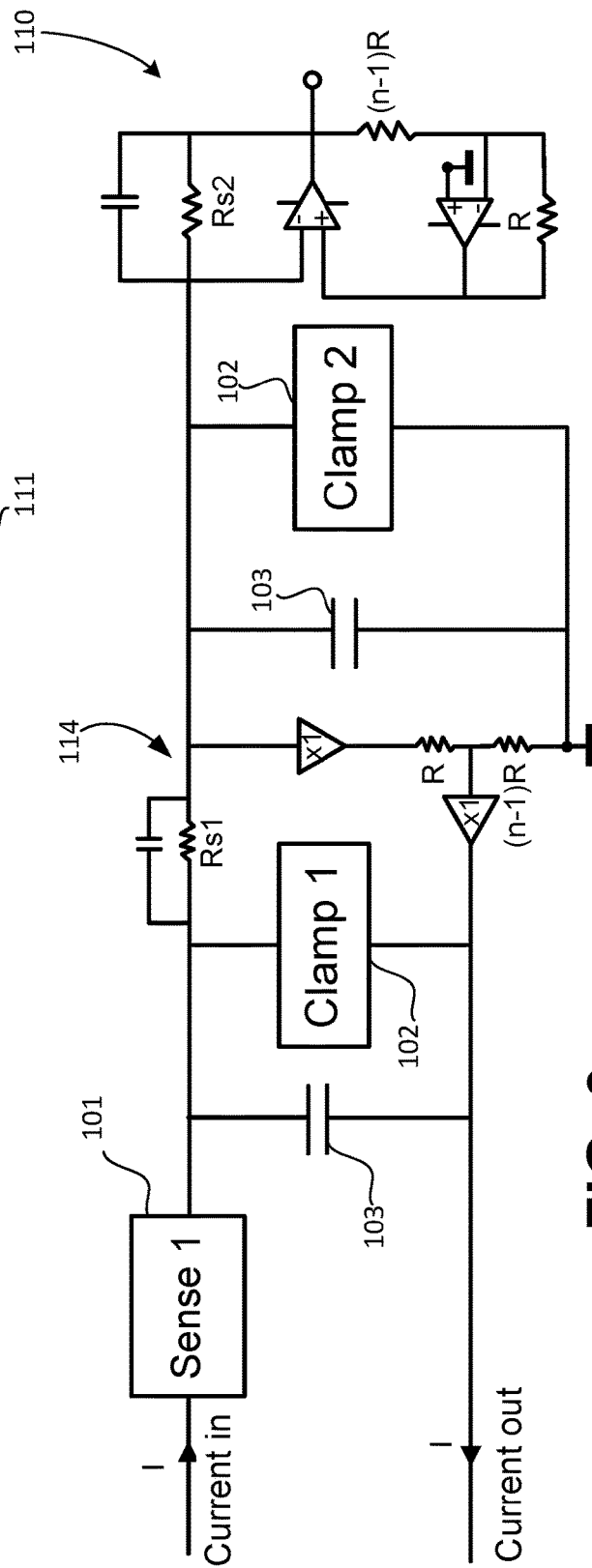
FIG. 9 is a circuit diagram of a current measurement device that uses a sense element, multiple active clamps, and multiple active shunts, according to embodiments.

FIG. 9 is a block circuit diagram, showing a method of current measurement that uses a sense element 101, multiple active clamps 102, and multiple active shunts 110, 114, according to embodiments. As illustrated in FIG. 9, two active shunts 110, 114 may be used together. In the illustrated configuration, the current return path may not be to ground, but the current return path may instead be to a floating connection driven by a buffer. The "n" ratios for the two stages may be the same or different, depending on the desired bandwidth, burden voltage, and output signal magnitude.

Accordingly, embodiments of the disclosed technology may provide any or all of the following advantages. Embodiments may take an active approach to improve an ammeter's or current measurement device's burden voltage, as opposed to simply reducing the value of the sense resistor. Use of an active clamp with limited gain stages and a bypass capacitor at the terminals may allow for wide bandwidth clamping operation that does not appear inductive at high frequencies. Also, the use of multiple simultaneous current ranges may target the needs of, for example, IOT developers wanting to observe operation of their device in two rapidly-interchanging modes (wake/sleep, transmit/standby, etc.). Additionally, the use of two different current shunts simultaneously may provide a greater dynamic range without suffering from range change glitching or missed measurements due to sudden transients.

Figure 10:
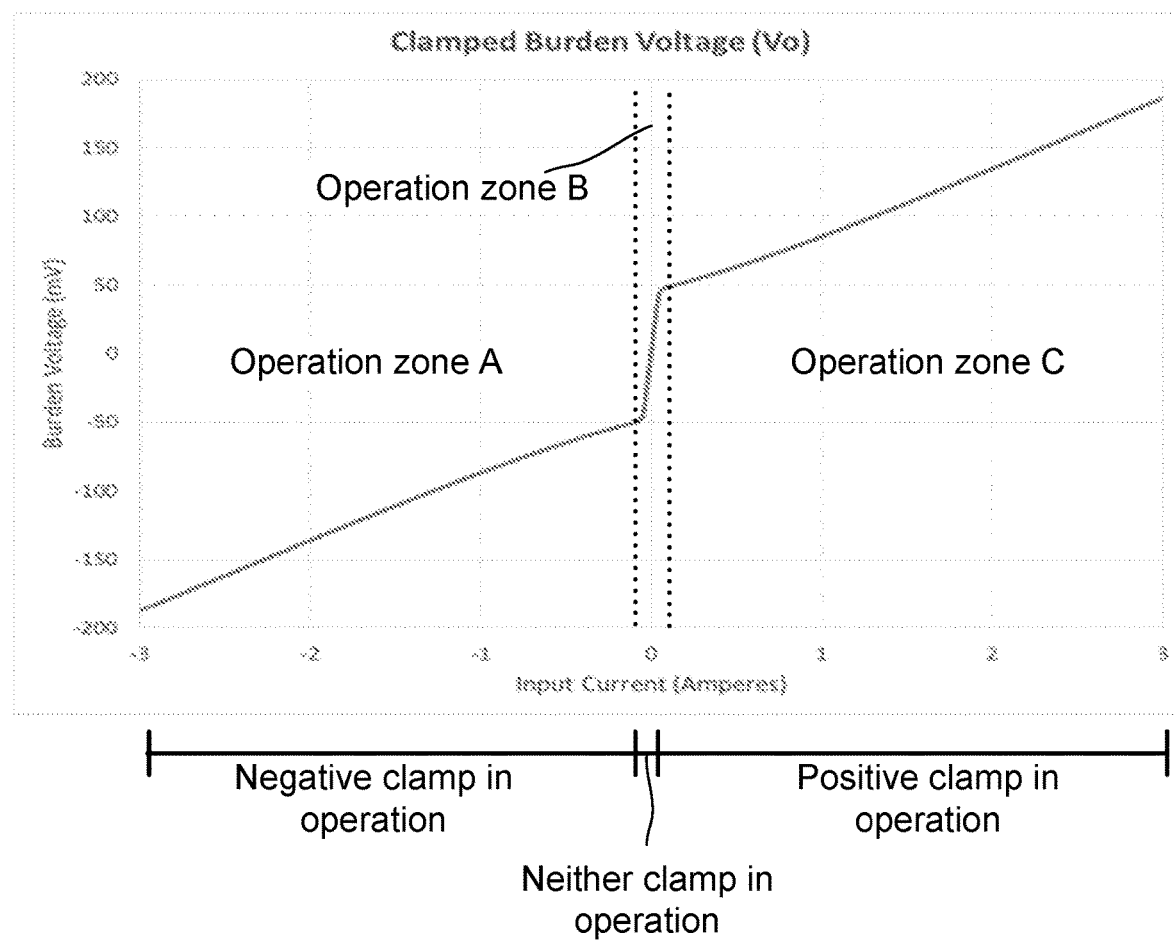
FIG. 10 is a graph of an output of a current measurement device that uses a sense element according to embodiments, on which various operations zones are labeled.

FIG. 10 is a graph of a burden voltage of a current measurement device that uses a sense element according to embodiments on which various operations zones are labeled according to device operation. This graph illustrates the burden voltage of a current measuring device that has a single range of measurement in which the active clamp 102 is not active, such as the device illustrated in FIG. 3 or 4. In multi-stage current measuring devices, such as the ones illustrated in FIGS. 5-9, there would be at least two zones where at least one of the active clamps 102 in the multi-stage current measuring device is not active. With reference to FIG. 10, an example clamped burden voltage Vo is graphed, and the graph is broken into three distinct Operation zones A, B, and C. Operation zone A includes a zone on the left side of the curve that has a gradual slope, Operation zone B is in the middle with a steep slope, and Operation zone C is on the right side of the curve having a gradual slope. With reference back to FIG. 3, the active clamp 102 is active in Operation zones A and C, but is not active in Operation zone B, which is the center portion having the steep slope. The shape of the clamped burden voltage Vo in Operation zone A of the graph of FIG. 10 is caused by the action of the negative-side clamp. This means the negative sensing element of the active clamp 102 has detected a negative voltage having an output large enough to cause the negative sensing element to turn on the active clamp 102, for example an NMOS transistor within the active clamp. Similarly, Operation zone C is caused by the action of the positive-side clamp, i.e., the combination of the positive sensing element and its coupled NMOS transistor. Operation zone B, conversely, is the burden voltage when the current measurement device is in its target zone, which for this embodiment is a zone having a burden voltage of +/−50 mV. In other embodiments, the values for the sense element 101 and the turn on voltages for the active clamp 102 may be selected so a different zone of operation is selected. Thus, Operation zone B is the region when the active clamp 102 is completely off and not passing any current, which means all the current through the current measurement device is being measured by the sense element 101.

As mentioned above, although the graph illustrated in FIG. 10 includes a single zone in which the active clamp is inactive, and has a steeper, more precise slope, the graph of the burden voltage of current measuring devices that include multiple zones, such as the ones illustrated in FIGS. 5-9, would include at least two zones where at least one of the active clamps 102 in the multi-stage current measuring device is not active, and thus there would be at least two areas of relatively steeper slope for the clamped burden voltage.

Hence, embodiments of the disclosed technology may provide current measurement capability over a greater range and with more resolution than existing solutions, without sacrificing on burden voltage or bandwidth.

As one example, at least some implementations having multiple active shunts in series and burden voltage clamping technology may provide the following characteristics:

High range Bandwidth: about 10 MHz; Low range Bandwidth: about 1 MHz; Noise floor: 0.4 $\mu A_{RMS}$; Base Accuracy: 0.05%+0.1 µA (calibrated); Measurement range: 3 A-100 nA; Burden voltage: 230 mV @ 2.2 A, which looks capacitive at high frequencies.

Embodiments may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the disclosed systems and methods, and such data structures are contemplated within the scope of computer executable instructions and computer-usable data described herein.

EXAMPLES

Illustrative examples of the technologies disclosed herein are provided below. An embodiment of the technologies may include any one or more, and any combination of, the examples described below.

Example 1 a test and measurement instrument including a current measurement device, including an input structured to accept an electrical current for measurement; an output structured to pass an output current output from the current measurement device; a sense path for electrical current having a sensing element structured to sense an amount of current received at the input; and an active bypass device structured to pass an amount of current from the input of the current measurement device to the output of the current measurement device without having passed through the sense path.

Example 2 is the test and measurement instrument of Example 1, in which the active bypass device is a clamping circuit.

Example 3 is the test and measurement instrument of Example 2, in which the active bypass device includes a controllable current shunting device having a control input coupled to an output of the sensing element.

Example 4 is the test and measurement instrument of Example 3, wherein the controllable current shunting device comprises one or more MOS transistors.

Example 5 is the test and measurement instrument of any of the preceding Examples 1-4, wherein the active bypass device comprises a voltage sensing device structured to sense a voltage at the output of the sensing element and generate an output voltage therefrom.

Example 6 is the test and measurement instrument of Example 5, in which the voltage sensing device includes a positive voltage sensing device and a negative voltage sensing device, and in which the output voltage of the voltage sensing device is structured to generate only a positive voltage based on the magnitude of the voltage sensed at the output of the sensing element.

Example 7 is the test and measurement instrument of any of preceding Examples 1-6, further comprising a capacitor coupled in parallel to the active bypass device, and in which a value of the capacitor is selected based on the electrical characteristics of the sensing element and the active bypass device.

Example 8 is the test and measurement instrument of Example 7, in which the sensing element, the active bypass device and the capacitor are configured to be a first sensing system tuned to a first range of input current values, and further comprising a second sensing system tuned to a second range of input current values, the first range being different from the second range.

Example 9 is the test and measurement instrument of Example 8, in which the second sensing system includes a second current sensing element, a second active bypass device, and a second capacitor.

Example 10 is the test and measurement instrument of Example 8, further comprising a multiplexer coupled to an output of the first sensing system and the second sensing system, and in which the multiplexer is selectable to pass either the output from the first sensing system or the second sensing system as the output of the current measuring device.

Example 11 is the test and measurement instrument of any of Examples 1-10, in which the sensing element comprises an active shunt.

Example 12 is a method for measuring current by an in-line current measuring device, including accepting an input current to be measured, measuring the value of the input current by a current sensing device, and actively bypassing current past the current sensing device when the input current is not within a first range of values.

Example 13 is a method according to Example 12, in which actively bypassing current past the current sensing device comprises controlling a current shunting device.

Example 14 is a method according to Example 13, in which controlling a current shunting device comprises driving the current shunting device with an input derived from an output of the current sensing device.

Example 15 is a method according to Example 13 in which the current shunting device is off when the input current is within a threshold amount of a target current within the first range of values.

Example 16 is a method according to Example 15 in which the target current is a positive current or a negative current.

Example 17 is a method according to any of the preceding Examples 12-16, further comprising measuring the value of the input current by a second current sensing device, and actively bypassing current past the second current sensing device using a second current shunting device when the input current is not within a second range of values different than the first range of values.

Example 18 is a method according to Example 17 in which the second current shunting device is off when the input current is within a threshold amount of a target current within the second range of values.

Example 19 is a method according to Example 18 in which the target current is a positive current or a negative current.

Example 20 is a method according to any of the preceding Examples 12-19, in which measuring the value of the input current by a current sensing device comprises measuring the value of the input current with an active shunt.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments have been illustrated and described for purposes of illustration, it will be understood that various modifications may be made without departing from the spirit and scope of the disclosure. Accordingly, the invention should not be limited except as by the appended claims.

We claim:

1. A test and measurement instrument including a current measurement device, comprising:
   an input structured to accept an electrical current for measurement;
   an output structured to pass an output current output from the current measurement device;
   a sense path for electrical current having a sensing element structured to sense the amount of current received at the input; and
   a controllable current shunting device structured to pass an amount of current from the input of the current measurement device to the output of the current measurement device without having passed through the sense path, the controllable current shunting device having a control input driven by and connected to a control signal output of the sensing element, the controllable current shunting device having a voltage sensing device structured to sense a voltage at the control signal output of the sensing element, the voltage sensing device comprising a positive voltage sensing device and a negative voltage sensing device and the output of the voltage sensing device is structured to generate only a positive voltage based upon a magnitude of the voltage sensed at the output of the sensing element.

2. The test and measurement instrument of claim 1, in which the active controllable current shunting device is a clamping circuit.

3. The test and measurement instrument of claim 1, wherein the controllable current shunting device comprises one or more MOS transistors.

4. The test and measurement instrument of claim 1, further comprising a capacitor coupled in parallel to the controllable current shunting device, and in which a value of the capacitor is selected based on the electrical characteristics of the sensing element and the controllable current shunting device.

5. The test and measurement instrument of claim 4, in which the sensing element, the controllable current shunting device and the capacitor are configured to be a first sensing system tuned to a first range of input current values, and further comprising a second sensing system tuned to a second range of input current values, the first range being different from the second range.

6. The test and measurement instrument of claim 5, in which the second sensing system comprises:
   a second current sensing element;
   a second controllable current shunting device; and
   a second capacitor.

7. The test and measurement instrument of claim 5, further comprising a multiplexer coupled to an output of the first sensing system and the second sensing system, and in which the multiplexer is selectable to pass either the output from the first sensing system or the second sensing system as the output of the current measurement device.

8. A method for measuring current by an in-line current measuring device, comprising:
   accepting an input current to be measured;
   measuring a value of the input current by a current sensing device;
   using a controllable current shunting device to actively bypass the input current to pass an amount of current from the input of the current sensing device to the output of the current sensing device without passing through a sense path of the current sensing device when the input current is not within a first range of values by controlling the amount of input current bypassed with a control signal generated by the current sensing device, the controllable current shunting device receiving the control signal from the current sensing device, the controllable current shunting device to use a voltage sensing device to sense a voltage of the control signal output from the current sensing element based upon a voltage magnitude sensed by the current sensing device;
   sensing, at the controllable current shunting device, the voltage magnitude for both positive voltages and negative voltages, the voltage sensing device comprising a positive voltage sensing device and a negative voltage sensing device; and
   generating only a positive voltage based upon a magnitude of the voltage sensed at the output of the sensing element.

9. The method of claim 8 in which the controllable current shunting device is off when the input current is within a threshold amount of a target current within the first range of values.

10. The method of claim 8, further comprising:
measuring the value of the input current by a second current sensing device; and
actively bypassing the input current past the second current sensing device using a second controllable current shunting device when the input current is not within a second range of values different than the first range of values.

11. The method of claim 10 in which the second controllable current shunting device is off when the input current is within a threshold amount of a target current within the second range of values.

12. The method of claim 11 in which the target current is a positive current or a negative current.

13. The test and measurement instrument of claim 1, in which the controllable current shunting device comprises limited-gain active circuits.

14. The test and measurement instrument of claim 1, wherein the controllable current shunting device limits power dissipation in the sensing element.

15. The method as claimed in claim 8, wherein actively bypassing the input current past the current sensing device limits power dissipation in the sensing element.

* * * * *